United States Patent [19]

Kaisaki et al.

[11] Patent Number: 5,856,373
[45] Date of Patent: Jan. 5, 1999

[54] DENTAL VISIBLE LIGHT CURABLE EPOXY SYSTEM WITH ENHANCED DEPTH OF CURE

[75] Inventors: David A. Kaisaki, St. Paul; Sumita B. Mitra, West St. Paul; William J. Schultz, Vadnais Heights; Robert J. DeVoe, Oakdale, all of Minn.

[73] Assignee: Minnesota Mining and Manufacturing Company, St. Paul, Minn.

[21] Appl. No.: 943,465

[22] Filed: Oct. 3, 1997

Related U.S. Application Data

[63] Continuation of Ser. No. 550,635, Oct. 31, 1995, abandoned, which is a continuation-in-part of Ser. No. 331,719, Oct. 31, 1994, abandoned.

[51] Int. Cl.⁶ .......................... C08L 63/00; C08L 63/02; A61K 6/08; C08K 3/00
[52] U.S. Cl. .......................... 522/25; 522/15; 522/146; 522/168; 522/170; 522/908; 522/81; 522/83; 522/77; 523/116; 523/117
[58] Field of Search .......................... 522/25, 31, 908, 522/170, 146, 15, 77, 81, 83; 523/116, 117

[56] References Cited

U.S. PATENT DOCUMENTS

| | | | |
|---|---|---|---|
| 3,515,552 | 6/1970 | Smith | 96/35.1 |
| 3,536,489 | 10/1970 | Smith | 96/28 |
| 3,617,288 | 11/1971 | Hartman | 96/90 |
| 3,640,718 | 2/1972 | Smith | 96/89 |
| 3,741,769 | 6/1973 | Smith | 96/35.1 |
| 3,779,778 | 12/1973 | Smith et al. | 96/115 |
| 3,808,006 | 4/1974 | Smith | 96/88 |
| 4,026,705 | 5/1977 | Crivello et al. | 96/27 |
| 4,090,936 | 5/1978 | Barton | 204/159 |
| 4,156,035 | 5/1979 | Tsao et al. | 427/44 |
| 4,173,476 | 11/1979 | Smith et al. | 430/280 |
| 4,175,972 | 11/1979 | Crivello | 204/159 |
| 4,231,951 | 11/1980 | Smith et al. | 560/466 |
| 4,250,053 | 2/1981 | Smith | 252/426 |
| 4,256,828 | 3/1981 | Smith | 430/280 |
| 4,318,766 | 3/1982 | Smith | 156/330 |
| 4,356,050 | 10/1982 | Crivello et al. | 156/273 |
| 4,378,277 | 3/1983 | Smith | 204/159 |
| 4,386,154 | 5/1983 | Smith et al. | 430/336 |
| 4,394,403 | 7/1983 | Smith | 427/42 |
| 4,442,197 | 4/1984 | Crivelio et al. | 430/280 |
| 4,460,677 | 7/1984 | Smith et al. | 430/336 |
| 4,593,051 | 6/1986 | Koleske | 522/31 |
| 4,657,779 | 4/1987 | Gaske | 522/25 |
| 4,694,029 | 9/1987 | Land | 522/8 |
| 4,731,394 | 3/1988 | Vogel et al. | 523/115 |
| 4,735,632 | 4/1988 | Oxman et al. | 522/25 |
| 4,771,112 | 9/1988 | Engelbrecht | 525/327 |
| 4,822,687 | 4/1989 | Kessel et al. | 428/447 |
| 4,835,193 | 5/1989 | Hayase et al. | 522/25 |
| 4,892,894 | 1/1990 | Koleske | 522/31 |
| 4,940,676 | 7/1990 | Evans | 501/16 |
| 4,950,696 | 8/1990 | Palazotto et al. | 522/25 |
| 4,985,340 | 1/1991 | Palazzotto et al. | 430/270 |
| 5,043,221 | 8/1991 | Koleske | 428/413 |
| 5,086,192 | 2/1992 | Kessel et al. | 556/9 |
| 5,116,885 | 5/1992 | Hattori et al. | . |
| 5,144,051 | 9/1992 | Kessel et al. | 556/64 |
| 5,146,005 | 9/1992 | Weitemeyer et al. | 568/616 |
| 5,189,077 | 2/1993 | Kerby | 523/116 |
| 5,217,805 | 6/1993 | Kessel et al. | 428/352 |
| 5,227,413 | 7/1993 | Mitra | 523/116 |
| 5,273,805 | 12/1993 | Calhoun et al. | 428/156 |
| 5,296,295 | 3/1994 | Perkins et al. | 428/412 |
| 5,332,797 | 7/1994 | Kessel et al. | 528/27 |

FOREIGN PATENT DOCUMENTS

| | | |
|---|---|---|
| 0 070 634 | 1/1983 | European Pat. Off. . |
| 0 119 425 | 9/1984 | European Pat. Off. . |
| 0 136 679 | 4/1985 | European Pat. Off. . |
| 0 330 117 | 8/1989 | European Pat. Off. . |
| 0 344 910 | 12/1989 | European Pat. Off. . |
| 0 678 533 | 10/1995 | European Pat. Off. . |
| WO 95/14716 | 1/1995 | WIPO . |
| WO 95/30402 | 11/1995 | WIPO . |

OTHER PUBLICATIONS

H.-J. Timpe, *Pure & Appl. Chem.*, vol. 60, No. 7, pp. 1033–1038, 1988.

N.J. Leonard and P. M. Mader, Journal of American Chemical Society vol. 72, pp. 5388–5397, 1950.

William R. Watt, UV Curing of Epoxides by Catonic Polymerization, Radiation Curing, Nov., 1986.

*Primary Examiner*—Susan W. Berman
*Attorney, Agent, or Firm*—Dale A. Bjorkman

[57] ABSTRACT

A visible-light photopolymerizable composition comprising a) a cationically polymerizable epoxy resin, b) a hydroxyl-containing material c) an aryliodonium salt and d) a visible light sensitizer that is an alpha-dicarbonyl compound having an extinction coefficient less than about 1000. Particularly preferred compositions of the present invention are dental materials.

36 Claims, No Drawings

DENTAL VISIBLE LIGHT CURABLE EPOXY SYSTEM WITH ENHANCED DEPTH OF CURE

This is a continuation of application Ser. No. 08/550,635 filed Oct. 31, 1995, now abandoned.

Which is a continuation-in-part application of U.S. application Ser. No. 08/331,719, filed Oct. 31, 1994, now abandoned.

FIELD OF THE INVENTION

This invention relates to photopolymerizable compositions. More specifically, this invention relates to compositions comprising epoxy resins that are photopolymerized.

BACKGROUND OF THE INVENTION

Epoxy compounds have previously been cured by various cationic initiator systems. U.S. Pat. No. 4,256,828 describes photocopolymerizable compositions containing epoxides, organic material with hydroxyl functionality, and a photosensitive aromatic sulfonium or iodonium salt of a halogen-containing complex ion. This patent also describes coated substrates. U.S. Pat. No. 4,250,053 describes sensitized aromatic iodonium or aromatic sulfonium salt photoinitiator systems for cationic reactions. U.S. Pat. No. 4,026,705 describes epoxy compositions that can be cured with visible radiant energy based on the use of certain organic dyes in combination with diarylhalonium salts. Cationic polymerization of various olefinic and cyclic organic compounds and organosilicon cyclics is also described.

SUMMARY OF THE INVENTION

The present invention provides a visible-light photopolymerizable composition comprising a) a cationically polymerizable epoxy resin, b) a hydroxyl-containing material c) an aryliodonium salt and d) a visible light sensitizer that is an alpha-dicarbonyl compound having an extinction coefficient less than about 1000. The components of this system are present in an amount sufficient to provide a cure depth of at least about 1 mm when said cationically polymerizable resin is exposed to visible light. Particularly preferred compositions of the present invention are dental materials.

DETAILED DESCRIPTION

It has been surprisingly discovered that compositions of the present invention provide systems with enhanced depth of cure using visible light. Previous epoxy-based resins provided rapid cure only for thin samples, such as utilized in coating and film technologies. Additionally, powerful and potentially harmful sources of radiation were previously required to achieve polymerization to a significant depth. Using visible light sources the present invention achieves enhanced depth of cure in a surprisingly short time, so that safer and less expensive equipment may now be utilized to cure epoxy resins to thicknesses not previously attainable.

The photopolymerizable compositions of the invention are sensitive throughout the visible spectral region, and photocure rapidly, without the use of heat, to polymers having desirable properties. For purposes of the present invention, visible light is defined as light having a wavelength of between about 400 and 700 nanometers. The photopolymerization of the compositions of the invention occurs on exposure of the compositions to any source of radiation emitting actinic radiation at a wavelength within the visible spectral region. Exposures may be from less than about 1 second to 10 minutes or more, depending upon the amounts and particular components of the compositions utilized and depending upon the radiation source and distance from the source and the thickness of the composition to be cured. The compositions of the invention are one-part, stable compositions having very good shelf life and good thermal stability.

The cationically polymerizable epoxy resins useful in the compositions of the invention comprise organic compounds having an oxirane ring, i.e.,

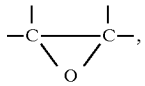

polymerizable by ring opening. Such materials, broadly called epoxides, include monomeric epoxy compounds and epoxides of the polymeric type and can be aliphatic, cycloaliphatic, aromatic or heterocyclic. These materials generally have, on the average, at least 1 polymerizable epoxy group per molecule, and preferably at least about 1.5 polymerizable epoxy groups per molecule. The polymeric epoxides include linear polymers having terminal epoxy groups (e.g., a diglycidyl ether of a polyoxyalkylene glycol), polymers having skeletal oxirane units (e.g., polybutadiene polyepoxide), and polymers having pendent epoxy groups (e.g., a glycidyl methacrylate polymer or copolymer). The epoxides may be pure compounds or may be mixtures containing one, two, or more epoxy groups per molecule. The "average" number of epoxy groups per molecule is determined by dividing the total number of epoxy groups in epoxy-containing material by the total number of epoxy molecules present.

These epoxy-containing materials may vary from low molecular weight monomeric materials to high molecular weight polymers and may vary greatly in the nature of their backbone and substituent groups. For example, the backbone may be of any type and substituent groups thereon can be any group that does not substantially interfere with cationic cure at room temperature. Illustrative of permissible substituent groups include halogens, ester groups, ethers, sulfonate groups, siloxane groups, nitro groups, phosphate groups, and the like. The molecular weight of the epoxy-containing materials may vary from about 58 to about 100,000 or more.

Useful epoxy-containing materials include those which contain cyclohexene oxide groups such as the epoxycyclohexanecarboxylates, typified by 3,4-epoxycyclohexylmethyl-3,4-epoxycyclohexanecarboxylate, 3,4-epoxy-2-methylcyclohexylmethyl-3,4-epoxy-2-methylcyclohexane carboxylate, and bis(3,4-epoxy-6-methylcyclohexylmethyl) adipate. For a more detailed list of useful epoxides of this nature, reference is made to the U.S. Pat. No. 3,117,099, incorporated herein by reference.

Further epoxy-containing materials which are particularly useful in the practice of this invention include glycidyl ether monomers of the formula

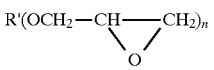

where R' is alkyl or aryl and n is an integer of 1 to 6. Examples are glycidyl ethers of polyhydric phenols obtained by reacting a polyhydric phenol with an excess of chlorohydrin such as epichlorohydrin (e.g., the diglycidyl ether of 2,2-bis-(2,3-epoxypropoxyphenol)-propane). Further examples of epoxides of this type which can be used in the practice of this invention are described in U.S. Pat. No. 3,018,262, incorporated herein by reference, and in "Handbook of Epoxy Resins" by Lee and Neville, McGraw-Hill Book Co., New York (1967).

There are a host of commercially available epoxy resins which can be used in this invention. In particular, epoxides which are readily available include octadecylene oxide, epichlorohydrin, styrene oxide, vinyl cyclohexene oxide, glycidol, glycidylmethacrylate, diglycidyl ether of Bisphenol A (e.g., those available under the trade designations "Epon 828", "Epon 825", "Epon 1004" and "Epon 1010" from Shell Chemical Co., "DER-331", "DER-332", and "DER-334", from Dow Chemical Co.), vinylcyclohexene dioxide (e.g., "ERL-4206" from Union Carbide Corp.), 3,4-epoxycyclohexylmethyl-3,4-epoxycyclohexene carboxylate (e.g., "ERL-4221" or "UVR 6110" or "UVR 6105" from Union Carbide Corp.), 3,4-epoxy-6-methylcyclohexylmethyl-3,4-epoxy-6-methyl-cyclohexene carboxylate (e.g., "ERL-4201" from Union Carbide Corp.), bis(3,4-epoxy-6-methylcyclohexylmethyl) adipate (e.g., "ERL-4289" from Union Carbide Corp.), bis(2,3-epoxycyclopentyl) ether (e.g., "ERL-0400" from Union Carbide Corp.), aliphatic epoxy modified with polypropylene glycol (e.g., "ERL-4050" and "ERL-4052" from Union Carbide Corp.), dipentene dioxide (e.g., "ERL-4269" from Union Carbide Corp.), epoxidized polybutadiene (e.g., "Oxiron 2001" from FMC Corp.), silicone resin containing epoxy functionality, flame retardant epoxy resins (e.g., "DER-580", a brominated bisphenol type epoxy resin available from Dow Chemical Co.), 1,4-butanediol diglycidyl ether of phenolformaldehyde novolak (e.g., "DEN-431" and "DEN-438" from Dow Chemical Co.), and resorcinol diglycidyl ether (e.g., "Kopoxite" from Koppers Company, Inc.). bis(3,4-epoxycyclohexyl)adipate (e.g., "ERL-4299" or "UVR-6128", from Union Carbide Corp.), 2-(3,4-epoxycyclohexyl-5,5-spiro-3,4-epoxy) cyclohexane-meta-dioxane (e.g., "ERL-4234" from Union Carbide Corp.), vinylcyclohexene monoxide (from Union Carbide Corp.), 1,2-epoxyhexadecane (e.g., "UVR-6216" from Union Carbide Corp.), alkyl glycidyl ethers such as alkyl $C_8$–$C_{10}$ glycidyl ether (e.g., "HELOXY Modifier 7" from Shell Chemical Co.), alkyl $C_{12}$–$C_{14}$ glycidyl ether (e.g., "HELOXY Modifier 8" from Shell Chemical Co.), butyl glycidyl ether (e.g., "HELOXY Modifier 61" from Shell Chemical Co.), cresyl glycidyl ether (e.g., "HELOXY Modifier 62" from Shell Chemical Co.), p-tert butylphenyl glycidyl ether (e.g., "HELOXY Modifier 65" from Shell Chemical Co.), polyfunctional glycidyl ethers such as diglycidyl ether of 1,4-butanediol (e.g., "HELOXY Modifier 67" from Shell Chemical Co.), diglycidyl ether of neopentyl glycol (e.g., "HELOXY Modifier 68" from Shell Chemical Co.), diglycidyl ether of cyclohexanedimethanol (e.g., "HELOXY Modifier 107" from Shell Chemical Co.), trimethylol ethane triglycidyl ether (e.g., "HELOXY Modifier 44" from Shell Chemical Co.), trimethylol propane triglycidyl ether (e.g., "HELOXY Modifier 48" from Shell Chemical Co.), polyglycidyl ether of an aliphatic polyol (e.g., "HELOXY Modifier 84" from Shell Chemical Co.), polyglycol diepoxide (e.g., "HELOXY Modifier 32" from Shell Chemical Co.), bisphenol F epoxides (e.g., "EPN-1138" or "GY-281" from Ciba-Geigy Corp.), 9,9-bis[4-(2,3-epoxypropoxy)-phenyl]fluorenone (e.g., "Epon 1079" from Shell Chemical Co.).

Still other epoxy resins contain copolymers of acrylic acid esters or glycidol such as glycidylacrylate and glycidylmethacrylate with one or more copolymerizable vinyl compounds. Examples of such copolymers are 1:1 styrene-glycidylmethacrylate, 1:1 methylmethacrylate-glycidylacrylate and a 62.5:24:13.5 methylmethacrylate-ethyl acrylate-glycidylmethacrylate.

Other useful epoxy resins are well known and contain such epoxides as epichlorohydrins, e.g., epichlorohydrin; alkylene oxides, e.g., propylene oxide, styrene oxide; alkenyl oxides, e.g., butadiene oxide; glycidyl esters, e.g., ethyl glycidate.

The polymers of the epoxy resin may optionally contain other functionalities that do not substantially interfere with cationic cure at room temperature.

Blends of various epoxy-containing materials are particularly contemplated in this invention. Examples of such blends include two or more molecular weight distributions of epoxy-containing compounds, such as low molecular weight (below 200), intermediate molecular weight (about 200 to 10,000) and higher molecular weight (above about 10,000). Alternatively or additionally, the epoxy resin may contain a blend of epoxy-containing materials having different chemical nature, such as aliphatic and aromatic, or functionality, such as polar and non-polar. Other cationically polymerizable polymers may additionally be incorporated.

The hydroxyl-containing material which is used in the present invention may be any liquid or solid organic material having hydroxyl functionality of at least 1, and preferably at least 2.

Preferably the hydroxyl-containing material contains two or more primary or secondary aliphatic hydroxyl groups (i.e., the hydroxyl group is bonded directly to a non-aromatic carbon atom). The hydroxyl group may be terminally situated, or they may be pendent from a polymer or copolymer. The molecular weight of the hydroxyl-containing organic material may vary from very low (e.g., 32) to very high (e.g., one million or more). Suitable hydroxyl-containing materials may have low molecular weights, i.e from about 32 to 200, intermediate molecular weight, i.e. from about 200 to 10,000, or high molecular weight, i.e. above about 10,000. As used herein, all molecular weights are weight average molecular weights.

The hydroxyl-containing material may optionally contain other functionalities that do not substantially interfere with cationic cure at room temperature. Thus, the hydroxyl-containing materials may optionally be nonaromatic in nature or may comprise aromatic functionality. The hydroxyl-containing material may optionally contain heteroatoms in the backbone of the molecule, such as nitrogen, oxygen, sulfur, and the like, provided that the ultimate hydroxyl-containing material does not substantially interfere with cationic cure at room temperature. The hydroxyl-containing material may, for example, be selected from naturally occurring or synthetically prepared cellulosic materials. Of course, the hydroxyl-containing material is also substantially free of groups which may be thermally or photolytically unstable; that is, the material will not decompose or liberate volatile components at temperatures below about 100° C. or in the presence of actinic light which may be encountered during the desired curing conditions for the photocopolymerizable composition.

Representative examples of suitable hydroxyl-containing materials having a hydroxyl functionality of 1 include alkanols, monoalkyl ethers of polyoxyalkyleneglycols, monoalkyl ethers of alkylene-glycols, and others known to the art.

Representative examples of useful monomeric polyhydroxy organic materials include alkylene glycols (e.g., 1,2-ethanediol; 1,3-propanediol; 1,4-butanediol; 1,6- hexanediol; 1,8-octanediol; 2-ethyl-1,6-hexanediol; bis (hydroxymethyl)cyclohexane; 1,18-dihydroxyoctadecane; 3-chloro-1,2-propanediol); polyhydroxyalkanes (e.g., glycerine, tri-methylolethane, pentaerythritol, sorbitol) and other polyhydroxy compounds such as N,N-bis (hydroxyethyl)benzamide; 2-butyne-1,4-diol; 4,4'-bis (hydroxymethyl)diphenylsulfone; castor oil; and the like.

Representative examples of useful polymeric hydroxyl-containing materials include polyoxyethylene and polyoxypropylene glycols, and particularly the polyoxyethylene and polyoxypropylene glycol diols and triols of molecular weights from about 200 to about 10,000 corresponding to equivalent weight of 100 to 5000 for the diols or 70 to 3300 for triols; polytetramethylene ether glycols (polytetrahydrofuran "poly THF") of varying molecular weight; copolymers of hydroxypropyl and hydroxyethyl acrylates and methacrylates with other free radical-polymerizable monomers such as acrylate esters, vinyl halides, or styrene; copolymers containing pendent hydroxy groups formed by hydrolysis or partial hydrolysis of vinyl acetate copolymers, polyvinylacetal resins containing pendent hydroxyl groups; modified cellulose polymers such as hydroxyethylated and hydroxypropylated cellulose; hydroxy-terminated polyesters; hydroxy-terminated polylactones, and particularly the polycaprolactones; fluorinated polyoxyethylene or polyoxypropylene glycols; and hydroxy-terminated polyalkadienes.

Useful commercially available hydroxyl-containing materials include the "Terathane" series (available from du Pont de Nemours) of polytetramethylene ether glycols such as "Terathane" 650, 1000, 2000 and 2900; "PeP" (available from Wyandotte Chemicals Corporation) of polyoxyalkylene tetrols having secondary hydroxyl groups such as "PeP" 450, 550 and 650; "Butvar" series (available from Monsanto Chemical Company) of polyvinylacetal resins such as "Butvar" B-72A, B-73, B-76, B-90 and B-98; and "Formvar" 7/70, 12/85, 7/95S, 7/95E, 15/95S and 15/95E; "Tone" series (available from Union Carbide) of polycaprolactone polyols such as "Tone" 0200, 0210, 0230, 0240, 0300; "Paraplex U-148" (available from Rohm and Haas), and aliphatic polyester diol; "Multron" R series (available from Mobay Chemical Co.) of saturated polyester polyols such as "Multron" R-2, R-12A, R-16, R-18, R-38, R-68 and R-74; "Klucel E" (available from Hercules Inc.) a hydroxypropylated cellulose having an equivalent weight of approximately 100; and "Alcohol Soluble Butyrate" (available from Eastman Kodak) a cellulose acetate butyrate ester having a hydroxyl equivalent weight of approximately 400; polyether polyols such as polypropylene glycol diol (e.g., "Arcol PPG-425", "Arcol PPG-725", "Arcol PPG-1025", "Arcol PPG-2025", "Arcol PPG-3025", "Arcol PPG-4025" from ARCO Chemical Co.); polypropylene glycol triol (e.g., "Arcol LT-28", "Arcol LHT-42", "Arcol LHT 112", "Arcol LHT 240", "Arcol LG-56", "Arcol LG168", "Arcol LG-650" from ARCO Chemical Co.); ethylene oxide capped polyoxypropylene triol or diol (e.g., "Arcol 11-27", "Arcol 11-34", "Arcol E351", "Arcol E-452", "Arcol E-785", "Arcol E-786" from ARCO Chemical Co.); ethoxylated bis-phenol A; propylene oxide or ethylene oxide-based polyols (e.g., "Voranol" polyether polyols such as "Voranol 230-056", "Voranol 220 series", "Voranol 230 series", "Voranol 240 series" from the Dow Chemical Co.).

The amount of hydroxyl-containing organic material used in the compositions of the invention may vary over broad ranges, depending upon factors such as the compatibility of the hydroxyl-containing material with the epoxide, the equivalent weight and functionality of the hydroxyl-containing material, the physical properties desired in the final cured composition, the desired speed of photocure, and the like.

Blends of various hydroxyl-containing materials are particularly contemplated in this invention. Examples of such blends include two or more molecular weight distributions of hydroxyl-containing compounds, such as low molecular weight (below 200), intermediate molecular weight (about 200 to 10,000) and higher molecular weight above about 10,000). Alternatively or additionally, the hydroxyl-containing material may contain a blend of hydroxyl-containing materials having different chemical nature, such as aliphatic and aromatic, or functionality, such as polar and non-polar. As an additional example, one may use mixtures of two or more poly-functional hydroxy materials or one or more mono-functional hydroxy materials with poly-functional hydroxy materials.

The aromatic iodonium complex salts are of the formula:

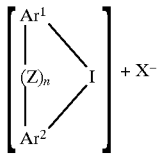

where $Ar^1$ and $Ar^2$ are aromatic groups having 4 to 20 carbon atoms and are selected from the group consisting of phenyl, thienyl, furanyl and pyrazolyl groups; Z is selected from the group consisting of oxygen; sulfur;

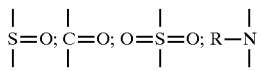

where R is aryl (of 6 to 20 carbons, such as phenyl) or acyl (of 2 to 20 carbons, such as acetyl, benzoyl, and the like.); a carbon-to-carbon bond; or

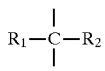

where $R_1$ and $R_2$ are selected from hydrogen, alkyl radicals of 1 to 4 carbons, and alkenyl radicals of 2 to 4 carbons; and n is zero or 1; and wherein X– is a halogen-containing complex anion selected from tetrafluoroborate, hexafluorophosphate, hexafluoroarsenate, and hexafluoroantimonate.

The aromatic iodonium cations are stable and are well known and recognized in the art. See for example, U.S. Pat. Nos. 3,565,906; 3,712,920; 3,759,989; and 3,763,187; F. Beringer, et al., Diaryliodonium Salts IX, J. Am. Chem. Soc. 81,342–51 (1959) and F. Beringer, et al., Diaryliodonium Salts XXII, J. Chem. Soc. 1964, 442–51; F. Beringer, et al., Iodonium Salts Containing Heterocyclic Iodine, J. Org. Chem. 30, 1141–8 (1965).

Representative $Ar^1$ and $Ar^2$ groups are aromatic groups having 4 to 20 carbon atoms selected from phenyl, thienyl, furanyl, and pyrazolyl groups. These aromatic groups may optionally have one or more fused benzo rings (e.g., naphthyl and the like; benzothienyl, dibenzothienyl; benzofuranyl, dibenzofuranyl; and the like.). Such aromatic groups may also be substituted, if desired, by one or more of the following non-basic groups which are essentially non-reactive with epoxide and hydroxy: halogen, nitro, N-arylamino groups, ester groups (e.g., alkoxycarbonyl such as methoxycarbonyl and ethoxycarbonyl, phenoxycarbonyl), sulfo ester groups (e.g., alkoxysulfonyl such as methoxysulfonyl and butoxysulfonyl, phenoxysulfonyl, and the like), amido groups (e.g., acetamido, butyramido, ethylsulfonamido, and the like), carbamyl groups (e.g., carbamyl, N-alkylcarbamyl, N-phenylcarbamyl, and the like), sulfamyl groups (e.g., sulfamyl, N-alkylsulfamyl, N,N-dialkylsulfamyl, N-phenylsulfamyl, and the like), alkoxy groups (e.g., methoxy, ethoxy, butoxy, and the like), aryl groups (e.g., phenyl), alkyl groups (e.g., methyl, ethyl, butyl, and the like), aryloxy groups (e.g., phenoxy) alkylsulfonyl (e.g., methylsulfonyl, ethylsulfonyl, and the like), arylsulfonyl groups (e.g., phenylsulfuonyl groups), perfluoroalkyl groups (e.g., trifluoromethyl, perfluoroethyl, and the like), and perfluoroalkysulfonyl groups (e.g., trifluoromethylsulfonyl, perfluorobutylsulfonyl, and the like).

Suitable examples of the aromatic iodonium complex salt photoinitiators include: diphenyliodonium tetrafluoroborate; di(4-methylphenyl)iodonium tetrafluoroborate; phenyl-4-methylphenyliodonium tetrafluoroborate; di(4-heptylphenyl)iodonium tetrafluoroborate; di(3-nitrophenyl) iodonium hexafluorophosphate; di(4-chlorophenyl) iodonium hexafluorophosphate; di(naphthyl)iodonium tetrafluoroborate; di(4-trifluoromethylphenyl)iodonium tetrafluoroborate; diphenyliodonium hexafluorophosphate; di(4-methylphenyl)iodonium hexafluorophosphate; diphenyliodonium hexafluoroarsenate; di(4-phenoxyphenyl) iodonium tetrafluoroborate; phenyl-2-thienyliodonium hexafluorophosphate; 3,5-dimethylpyrazolyl-4-phenyliodonium hexafluorophosphate; diphenyliodonium hexafluoroantimonate; 2,2'-diphenyliodonium tetrafluoroborate; di(2,4-dichlorophenyl)iodonium hexafluorophosphate; di(4-bromophenyl)iodonium hexafluorophosphate; di(4-methoxyphenyl)iodonium hexafluorophosphate; di(3-carboxyphenyl)iodonium hexafluorophosphate; di(3-methoxycarbonylphenyl)iodonium hexafluorophosphate; di(3-methoxysulfonylphenyl)iodonium hexafluorophosphate; di(4-acetamidophenyl)iodonium hexafluorophosphate; di(2-benzothienyl)iodonium hexafluorophosphate; and the diaryliodonium hexafluoroantimonate (cl 10 12).

Of the aromatic iodonium complex salts which are suitable for use in the compositions of the invention the preferred salts are the diaryliodonium hexafluorophosphate and the diaryliodonium hexafluoroantimonate. These salts are preferred because, in general, they are more thermally stable, promote faster reaction, and are more soluble in inert organic solvents than are other aromatic iodonium salts of complex ions.

The aromatic iodonium complex salts may be prepared by metathesis of corresponding aromatic iodonium simple salts (such as, for example, the diphenyliodonium bisulfate) in accordance with the teachings of Beringer, et al., J. Am. Chem. Soc 81,342 (1959). Thus, for examples, the complex salt diphenyliodonium tetrafluoroborate is prepared by the addition at 60° C. of an aqueous solution containing 29.2 g (150 millimoles) silver fluoroborate, 2 g. fluoroboric acid, and 0.5 g phosphorous acid in about 30 ml of water to a solution of 44 g (139 millimoles) of diphenyliodonium chloride. The silver halide that precipitates is filtered off and the filtrate concentrated to yield diphenyliodonium fluoroborate which may be purified by recrystallization.

The aromatic iodonium simple salts may be prepared in accordance with Beringer et al., above, by various methods including (1) coupling of two aromatic compounds with iodyl sulfate in sulfuric acid, (2) coupling of two aromatic compounds with an iodate in acetic acid-acetic anhydride-sulfuric acid, (3) coupling of two aromatic compounds with an iodine acylate in the presence of an acid, and (4) condensation of an iodoso compound, an iodoso diacetate, or an iodoxy compound with another aromatic compound in the presence of an acid. Diphenyliodonium bisulfate is prepared by method (3), for example, by the addition over a period of eight hours at below 5° C. of a mixture of 35 ml of conc. sulfuric acid and 50 ml of acetic anhydride to a well-stirred mixture of 55.5 ml of benzene, 50 ml of acetic anhydride, and 53.5 g of potassium iodate. The mixture is stirred for an additional four hours at 0°–5° C. and at room temperature for 48 hours and treated with 300 ml of diethyl ether. On concentration, crude diphenyliodonium bisulfate precipitates. If desired, it may be purified by recrystallization.

The diaryl iodonium salt is preferably present in the composition in amounts between about 0.01–10% by weight, more preferably between about 0.02–5% by weight, and most preferably between about 0.05–4% by weight.

The visible light sensitizer is an alpha-dicarbonyl compound having an extinction coefficient less than about 1000. Preferably, the visible light sensitizer is an alpha-diketone having an extinction coefficient less than about 1000.

A sensitizer is selected based in part upon shelf stability considerations. Accordingly, selection of a particular sensitizer may depend to some extent upon the particular epoxy, hydroxy-containing material and iodonium salt chosen.

Sensitizers useful in the present compositions have an extinction coefficient below about 1000, more preferably below about 200, and most preferably below about 150, at the desired wavelength of irradiation for photopolymerization.

By way of example, a preferred class of alpha-dicarbonyl sensitizers has the formula:

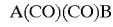

A(CO)(CO)B where A and B can be the same or different and can be hydrogen or substituted (having one or more non-interfering substituents) or unsubstituted aryl, alkyl, alkryl, or aralkyl groups, or together A and B can form a cyclic structure which can be a substituted or unsubstituted cycloaliphatic, aromatic, heteroaromatic or fused aromatic ring.

Examples of particularly preferred visible light sensitizers include camphorquinone; glyoxal; biacetyl; 3,3,6,6-tetramethylcyclohexanedione; 3,3,7,7-tetramethyl-1,2-cycloheptanedione; 3,3,8,8-tetramethyl-1,2-cyclooctanedione; 3,3,18,18-tetramethyl-1,2-cyclooctadecanedione; dipivaloyl; benzil; hydroxybenzil; 2,3-butanedione; 2,3-pentanedione; 2,3-hexanedione; 3,4-hexanedione; 2,3-heptanedione; 3,4-heptanedione; 2,3-octanedione; 4,5-octanedione; and 1,2-cyclohexanedione.

The visible light sensitizer is preferably present in the composition in amounts between about 0.01–10% by weight, more preferably between about 0.02–5% by weight, and most preferably between about 0.05–4% by weight.

The photopolymerizable compositions of the invention are prepared by simply admixing, under "safe light" conditions, the components of the inventive compositions. Suitable inert solvents may be employed if desired when effecting this mixture. Examples of suitable solvents are acetone and acetonitrile, and includes any solvent which does not react appreciably with the components of the inventive compositions. A liquid material to be polymerized may be used as a solvent for another liquid or solid material to be polymerized. Solventless compositions can be prepared by simply dissolving the aromatic iodonium complex salt and sensitizer in the epoxy resin or hydroxyl-containing material with or without the use of mild heating.

Dental applications particularly benefit from the unique compositions of the present invention. Until now, acrylate and methacrylate chemistry has been used extensively for adhesive and restorative dental compositions. This chemistry advantageously can be cured with visible light using photoinitiator systems. However, this chemistry has the disadvantage of a relatively high degree of shrinkage during the polymerization process. In contrast, during polymerization, the epoxy resins of the present invention shrink significantly less than the acrylate and methacrylate resins of the prior art. The present invention provides a system for curing epoxy resins in an acceptable time frame and to sufficient depth using visible light source equipment already available in the dental office.

The unique dental materials of the present invention may be filled or unfilled and include dental materials such as direct esthetic restorative materials (e.g., anterior and posterior restoratives), prostheses, adhesives and primers for oral hard tissues, sealants, veneers, cavity liners, orthodontic bracket adhesives for use with any type of bracket (such as metal, plastic and ceramic), crown and bridge cements, artificial crowns, artificial teeth, dentures, and the like. These dental materials are used in the mouth and are disposed adjacent to natural teeth. The phrase "disposed adjacent to" as used herein will refer to the placing of a dental material in temporary or permanent bonded (e.g., adhesive) or touching (e.g., occlusal or proximal) contact with a natural tooth. The term "composite" as used herein will refer to a filled dental material. The term "restorative" as used herein will refer to a composite which is polymerized after it is disposed adjacent to a tooth. The term "prosthesis" as used herein will refer to a composite which is shaped and polymerized for its final use (e.g., as crown, bridge, veneer, inlay, onlay or the like) before it is disposed adjacent to a tooth. The term "sealant" as used herein will refer to a lightly filled composite or to an unfilled dental material which is cured after it is disposed adjacent to a tooth. "Polymerizable", as used herein, refers to curing or hardening the dental material, e.g., by free-radical, ionic or mixed reaction mechanisms.

In certain applications, the use of a filler may be appropriate. The choice of filler affects important properties of the composite such as its appearance, radiopacity and physical and mechanical properties. Appearance is affected in part by adjustment of the amounts and relative refractive indices of the ingredients of the composite, thereby allowing alteration of the translucence, opacity or pearlescence of the composite. Epoxy resin compositions of the invention, either alone or in admixture with diluent monomer, can be prepared with refractive indices which approach or approximate the refractive indices of fillers such as quartz (refractive index 1.55), submicron silica (1.46), and 5.5:1 mole ratio $SiO_2:ZrO_2$ non-vitreous microparticles (1.54). In this way the appearance of the dental material can, if desired, be made to closely approximate the appearance of natural dentition.

Radiopacity is a measurement of the ability of the composite to be detected by x-ray examination. Frequently a radiopaque composite will be desirable, for instance, to enable the dentist to determine whether or not a filling remains sound. Under other circumstances a non-radiopaque composite may be desirable.

The amount of filler which is incorporated into the composite (referred to herein as the "loading level" and expressed as a weight percent based on the total weight of the dental material) will vary depending on the type of filler, the epoxy resin and other components of the composition, and the end use of the composite.

For some dental materials (e.g., sealants), the epoxy resin compositions of the invention can be lightly filled (e.g., having a loading level of less than about 40 weight percent) or unfilled. Preferably the viscosity of the dental material is sufficiently low to allow its penetration into pits and fissures of occlusal tooth surfaces as well as into etched areas of enamel, thereby aiding in the retention of the dental material. In applications where high strength or durability are desired (e.g., anterior or posterior restoratives, prostheses, crown and bridge cements, artificial crowns, artificial teeth and dentures) the loading level can be as high as about 95 weight percent. For most dental restorative and prosthetic applications a loading level of between about 70 and 90 weight percent is generally preferred.

Fillers may be selected from one or more of any material suitable for incorporation in compositions used for medical applications, such as fillers currently used in dental restorative compositions and the like. The filler is finely divided and preferably has a maximum particle diameter less than about 50 micrometers and an average particle diameter less than about 10 micrometers. The filler can have a unimodal or polymodal (e.g., bimodal) particle size distribution. The filler can be an inorganic material. It can also be a crosslinked organic material that is insoluble in the polymerizable resin, and is optionally filled with inorganic filler. The filler should in any event be non-toxic and suitable for use in the mouth. The filler can be radiopaque, radiolucent or nonradiopaque.

Examples of suitable inorganic fillers are naturally-occurring or synthetic materials such as quartz, nitrides (e.g., silicon nitride), glasses derived from, for example Ce, Sb, Sn, Zr, Sr, Ba and Al, colloidal silica, feldspar, borosilicate glass, kaolin, talc, titania, and zinc glass; low Mohs hardness fillers such as those described in U.S. Pat. No. 4,695,251; and submicron silica particles (e.g., pyrogenic silicas such as the "Aerosil" Series "OX 50", "130", "150" and "200" silicas sold by Degussa and "Cab-O-Sil M5" silica sold by Cabot Corp.). Examples of suitable organic filler particles include filled or unfilled pulverized polycarbonates, polyepoxides, and the like. Preferred filler particles are quartz, submicron silica, and non-vitreous microparticles of the type described in U.S. Pat. No. 4,503,169. Metallic fillers may also be incorporated, such as particulate metal filler made from a pure metal such as those of Groups IVA, VA, VIA, VIIA, VIII, IB, or IB, aluminum, indium, and thallium of Group IIIB, and tin and lead of Group IVB, or alloys thereof. Conventional dental amalgam alloy powders, typically mixtures of silver, tin, copper, and zinc, may also optionally be incorporated. The particulate metallic filler preferably has an average particle size of about 1 micron to about 100 microns, more preferably 1 micron to about 50 microns. Mixtures of these fillers are also contemplated, as well as combination fillers made from organic and inorganic materials. Fluoroaluminosilicate glass fillers, either untreated or silanol treated, are particularly preferred. These glasses have the added benefit of releasing fluoride at the site of dental work when placed in the oral environment.

Optionally, the surface of the filler particles may be treated with a surface treatment such as a coupling agent in order to enhance the bond between the filler and the polymerizable resin. The coupling agent may be functionalized with reactive curing groups, such as acrylates, methacrylates, epoxies, and the like. Examples of coupling agents include gamma-methacryloxypropyltrimethoxysilane, gammamercaptopropyltriethoxysilane, gamma-aminopropyltrimethoxysilane, beta-(3,4-epoxycyclohexyl) ethyltrimethoxysilane, gamma-glycidoxypropyltrimethoxysilane, and the like.

The dental materials of the present invention can also contain suitable adjuvants such as accelerators, inhibitors, absorbers, stabilizers, pigments, dyes, viscosity modifiers, surface tension depressants and wetting aids, antioxidants, and other ingredients well known to those skilled in the art.

The amounts and types of each ingredient in the dental material should be adjusted to provide the desired physical and handling properties before and after cure. For example, the cure rate, cure stability, fluidity, compressive strength, tensile strength and durability of the dental material typically are adjusted in part by altering the types and amounts of polymerization initiator(s) and, if present, the loading and particle size distribution of filler(s). Such adjustments typically are carried out empirically based on experience with dental materials of the prior art.

When the dental material is applied to a tooth, the tooth can optionally be pre-treated with a primer such as dentin or enamel adhesive by methods known to those skilled in the art.

Particularly useful compositions of the present invention are visible-light photopolymerizable dental composition useful for polymerization in the oral environment. These compositions comprise a) a cationically polymerizable epoxy resin, b) a hydroxyl-containing material, c) an arylidodonium salt, d) a visible light sensitizer having an extinction coefficient less than about 1000 lm$^{-1}$ cm$^{-1}$ in the visible light range and having a Sensitizer Test pH of less than about 3, and e) a dental filler present in the composition as at least about 50% by weight of the total composition. These components are present in amounts sufficient to provide cure of said photopolymerizable resin by exposure to visible light to a cure depth of at least about 1 mm. Other preferred compositions comprise a) a cationically polymerizable epoxy resin, b) a hydroxyl-containing material, c) an arylidodonium salt, and d) a visible light sensitizer having an extinction coefficient less than about 1000 lm$^{-1}$ cm$^{-1}$ in the visible light range and having a Sensitizer Test pH of less than about 3. These components are also present in amounts sufficient to provide cure of said photopolymerizable resin by exposure to visible light to a cure depth of at least about 1 mm, and more preferably, to a depth of at least about 5 mm. The compositions may additionally comprise cationically curable resins selected from oxetanes, oxolanes, cyclic acetals, lactams, lactones and vinyl ethers.

While epoxy resins have been used previously for dentures and the like, the present system is unique because it surprisingly is now possible to achieve cure speed and depth of cure of epoxy systems as defined herein to provide an effective in situ curable dental material. Until now, it was thought that epoxy-type systems would have to be cured extra-orally. The present system, in contrast, is specifically designed for intra-oral polymerization.

Examples of preferred sensitizers include the poly arylenes having 3 or more conjugated double bonds, such as 1,8-Diphenyl-1,3,5,7-octatetraene and 1,6-Diphenyl-1,3,5-hexatriene (Example 37,38); alpha-dicarbonyl compounds, such as camphorquinone, benzil, furil and phenanthrene-quinone; coumarin compounds, such as Coumarin 334; and aryl substituted isobenzofurans, such as 1,3-diphenyl isobenzofurans.

The following examples are given to illustrate, but not limit, the scope of this invention. Unless otherwise indicated, all parts and percentages are by weight, and all molecular weights are weight average molecular weight.

EXAMPLES 1-6

A mixture of 2.6860 grams epoxy resin UVR 6110 from Union Carbide, 0.2985 grams polytetrahydrofuran, average molecular weight=250 (pTHF-250), 0.0150 gram diphenyliodoniumhexafluoroantimonate (($C_6H_5$)$_2$ISbF$_6$) and 0.0150 gram camphorquinone (CPQ) was combined and stirred in the absence of light for twelve hours until homogeneous. The transparent mixture was stable at room temperature in the absence of light. Examples 2–5 were prepared in a similar manner as Example 1 using the ingredients listed in Table 1. Each formulation totaled approximately 3 grams. For comparative purposes, in Example 6 a mixture of UVR 6110, initiator, and sensitizer with no hydroxyl-containing materials was made.

TABLE 1

| Example | UVR 6110 Weight % | pTHF-250 Weight % | ($C_6H_5$)$_2$ISbF$_6$ Weight % | CPQ Weight % |
|---|---|---|---|---|
| 1 | 89 | 10 | 0.5 | 0.5 |
| 2 | 79 | 20 | 0.5 | 0.5 |
| 3 | 69 | 30 | 0.5 | 0.5 |
| 4 | 59 | 40 | 0.5 | 0.5 |
| 5 | 49 | 50 | 0.5 | 0.5 |
| 6 | 99 | 0 | 0.5 | 0.5 |

Polymerization Test Method 1

436 Visible Light Photolysis using Photo-DSC technique:

To demonstrate the extent of polymerization of the Examples during irradiation with visible light, the degree of cure when irradiated by light with a wavelength of 436 nm was measured using a Seiko differential scanning calorimeter (DSC) fitted with a 200 watt mercury-xenon lamp which was filtered so as only to emit light at a wavelength of 436 nm (Seiko No. DSC220C with PDC 121 unit, Seiko Instruments USA, Inc., Torrance, Calif. A sample weighing between 6–12 milligram was placed in a DSC liquid sample pan and irradiated for 5 minutes using the aforementioned light source fitted with quartz fiber optic cables to guide the light. The intensity of the light was measured and found to be between about 54–62 microwatt/cm$^2$ at a wavelength of 436 nm. The heat evolved during irradiation at 35° C. was measured ($\Delta H_p$). The presence of unreacted epoxy groups after the photolysis was completed was measured by increasing the temperature of the sample to 250°–300° C. immediately after the initial photolysis and measuring the resultant thermal polymerization exotherm ($\Delta H_{th}$). The exotherm during this thermal polymerization process occurred between 60° C. and 200° C. The total heat evolved from the polymerization all of the monomer units that react under these conditions is represented by $\Delta H_T$, where $$\Delta H_T = \Delta H_p + \Delta H_{th}. \qquad \text{eq. 1}$$

The extent of the cure during photolysis was quantified by determining the relative percent conversion of epoxy groups during photolysis, where $$\text{Relative Percent Conversion} = (\Delta H_p + \Delta H_T) \times 100. \qquad \text{eq.2}$$

The higher the relative percent conversion, the greater the extent of cure during the photolysis. This invention provides compositions which exhibit significant degrees of cure during visible light irradiation.

The percent conversion during a 5 minute visible light photolysis using Polymerization Test Method 1 for Examples 1–6 is shown in Table 2. As the amount of the hydroxyl-containing additive increased, the extent of cure during the photolysis increased to a point where all of the epoxy groups that could potentially polymerize in the mixture due to thermal or photochemical initiation did so under conditions of visible light irradiation, thus leaving no remaining thermally reactive epoxy groups. In contrast, the comparative example, Example 6, which contained no hydroxyl-containing additives, exhibited a very low extent of polymerization during the visible light irradiation. This demonstrates the ability of this invention to provide compositions which can undergo significant cure using visible light initiation sources.

TABLE 2

| Example | pTHF-250 Weight % | $\Delta H_T$ mJoules/mg | $\Delta H_p$ mJoules/mg | $\Delta H_{th}$ mJoules/mg | % Conversion |
|---|---|---|---|---|---|
| 1 | 10% pTHF-250 | −453.9 | −204.3 | −249.6 | 45 |
| 2 | 20% pTHF-250 | −401.7 | −269.7 | −132 | 67 |
| 3 | 30% pTHF-250 | −290.1 | −281.1 | −9 | 97 |
| 4 | 40% pTHF-250 | −318.7 | −318.7 | 0 | 100 |
| 5 | 50% pTHF-250 | −249.3 | −249.3 | 0 | 100 |
| 6 | — | −673.0 | −8.7 | −664.3 | 1 |

Polymerization Test Method 2

3M™ Visilux™ 2 Visible Light Curing Unit Photolysis:

In another series of experiments, the extent of cure during photolysis using a Visilux™ 2 visible light source was examined. This source is a filtered lamp which emitted light in the range of wavelengths of approximately 400 nm to 480 nm. In these experiments, a sample was irradiated for varying amounts of exposure time using a Visilux™ 2 source at a distance of 10 mm. The residual epoxy functional groups which did not react during the photolysis were quantified using a Seiko DSC. The temperature of the sample after photolysis at about 25° C. was immediately increased to 250° C.–300° C. and the heat due to the thermally induced polymerization of unreacted epoxy groups ($\Delta H_{th}$) was measured. From eq. 1, the exotherm due to the polymerization during visible light irradiation, $\Delta H_p$, was defined as $$\Delta H_p = \Delta H_T - \Delta H_{th}. \qquad \text{eq. 3}$$

Since $\Delta H_p$ was not measured directly using the Visilux™ 2 light source in this test, it was determined through measurement of $\Delta H_T$ by initiating the polymerization exclusively using thermal means. In this instance, the subsequent polymerization exotherm $\Delta H_{th}$ also equals $\Delta H_T$. Therefore, the relative percent conversion or reactive epoxy groups during photolysis is given by $$\text{Relative Percent Conversion} = ((\Delta H_{Ti} - \Delta H_{th})/\Delta H_T) \times 100. \qquad \text{eq. 4}$$

As shown in Table 3, significant conversion of the samples having the formulas described in Table 1 was obtained after only five seconds photolysis using Polymerization Test Method 2. As the concentration of hydroxyl-containing material was increased, the maximum conversion obtainable by photolysis increased to nearly full conversion with a formulation of 20% p-THF-250. In contrast, Comparative Example 6 showed a lower or zero percent conversion after up to 60 seconds irradiation time.

TABLE 3

| Example | Photolysis Time (seconds) | $\Delta H_T$ mJoules/mg | $\Delta H_{th}$ mJoules/mg | % Conversion |
|---|---|---|---|---|
| 1 | 0 | −561.8 | −561.8 | 0 |
| 1 | 5 | −561.8 | −310.1 | 45 |
| 1 | 10 | −561.8 | −328.1 | 42 |
| 1 | 20 | −561.8 | −322.4 | 43 |
| 1 | 60 | −561.8 | −304.7 | 46 |
| 2 | 0 | −483.8 | −483.8 | 0 |
| 2 | 5 | −483.8 | −67.5 | 87 |
| 2 | 10 | −483.8 | −12.3 | 97 |
| 2 | 20 | −483.8 | −12.1 | 98 |
| 2 | 60 | −483.8 | −5.4 | 99 |
| 6 | 0 | −595.1 | −595.1 | 0 |
| 6 | 5 | −610.1 | −610.1 | 0 |
| 6 | 10 | −618.4 | −618.4 | 0 |
| 6 | 20 | −595.1 | −573.4 | 4 |
| 6 | 60 | −595.1 | −504.6 | 15 |

Depth Of Cure

This test measured the ability of a composition to undergo visible light cure to significant depths (greater than or equal to 1 mm, 5 mm or 10 mm as appropriate, penetration of cure) using the Barcol A hardness test.

The depth of cure of a sample was measured after irradiation for 60 seconds with a Visilux™ 2 light source. A polytetrafluoroethylene (PTFE) block of appropriate thickness (5 or 10 mm) which had a cylindrical hole measuring about 6.35 mm or less in diameter that extended through the thickness of the block was placed on a film of transparent polyethylene terephthalate (PET) such that one end of the open cylindrical hole of the die was covered by the PET film. The PTFE die was then filled with the sample and another film of PET was placed on the top of the die, covering the liquid sample which was contained in the cylindrical hole. The sample was then irradiated with the Visilux™ 2 light source for 60 seconds by placing the light wand directly on the PET film which covered the sample at the top of the die. After irradiation, the PET films were removed and the hardness of the sample at the bottom of the die was measured using a Barber-Coleman Impressor (a hand-held portable hardness tester; Model No. GYZJ 934-1; from Barber Colemen Co. Industrial Instruments Division, Lovas Park, Ind. equipped with an indenter. For each composition tested, three samples were irradiated, with five reading taken at the bottom of each sample. The readings were averaged for each composition. A hardness value of zero indicated that the polymerization did not extend to the bottom of the sample.

TABLE 4

| | Hardness | |
|---|---|---|
| Example | 5 mm depth | 10 mm depth |
| 1 | 35 | 28 |
| 2 | 13 | 16 |
| 6 | 0 | 0 |

The Examples containing the hydroxyl-containing material (pTHF-250) exhibited significant depths of cure after 60 seconds Visilux™ 2 light exposure as indicated by the hardness values of samples which were 5 and 10 millimeters thick (Table 4). The Comparative Example 6, which had no hydroxyl-containing material, did not yield a measurable hardness at any depth tested.

EXAMPLES 7–23

These Examples describe the preparation of compositions containing a cationically curable epoxy resin, an iodonium salt initiator, an alpha diketone sensitizer, and various hydroxyl-containing materials. In Example 7, a mixture comprised of 2.4210 grams UVR 6110, 0.6105 gram Tone 201, 0.0151 gram $(C_6H_5)_2ISbF_6$, and 0.0154 gram CPQ was made and stirred until a homogeneous mixture was obtained. In a similar manner, Examples 8–23 were made with the total weight of each composition equaling approximately 3 grams. The components for Examples 8–23 are described in part in Table 5, with the epoxy resin UVR 6110 comprising the remainder of the composition for each example. Where necessary, mild heat was used to dissolve all of the ingredients in the composition.

The extent of cure during a 5 minute visible light photolysis was measured using Polymerization Test Method 1. The results are also listed in Table 5. Each hydroxyl-containing additive increased the extent of the visible light photocure.

TABLE 5

Visible light - Various additives

| Examples | Additive Weight % | $C_6IH_5SbF_6$ Weight % | CPQ Weight % | $\Delta H_T$ mJoules/mg | $\Delta H_p$ mJoules/mg | $\Delta H_{th}$ mJoules/mg | % conversion |
|---|---|---|---|---|---|---|---|
| 7  | 20% TONE 201      | 0.5% | 0.5%  | −493.8 | −117.6 | −376.2 | 24 |
| 8  | 20% TONE 301      | 0.5% | 0.5%  | −389.2 | −167.6 | −221.6 | 43 |
| 9  | 10% TONE 301      | 0.5% | 0.5%  | −614.7 | −133.7 | −514.0 | 22 |
| 10 | 20% PPG-400       | 0.5% | 0.5%  | −368.5 | −122.4 | −246.1 | 33 |
| 11 | 20% PEG-400       | 0.5% | 0.5%  | −497.0 | −197.9 | −299.1 | 40 |
| 12 | 20% PEG-200       | 0.5% | 0.5%  | −399.9 | −234.2 | −165.7 | 59 |
| 13 | 20% TEG           | 0.5% | 0.5%  | −552.8 | −383.1 | −169.7 | 70 |
| 14 | 10% dodecanol     | 0.5% | 0.5%  | −561.4 | −126.7 | −434.7 | 23 |
| 15 | 20% dodecanol     | 0.5% | 0.5%  | −559.7 | −240.2 | −319.5 | 43 |
| 16 | 10% butanediol    | 0.5% | 0.5%  | −556.8 | −352.3 | −204.5 | 63 |
| 17 | 40% PS556         | 0.5% | 0.5%  | −337.2 | −124.6 | −212.6 | 37 |
| 18 | 21% TONE 301      | 0.5% | 0.25% | −440.6 | −182.6 | −258.0 | 41 |
| 19 | 10% Tetrathane 1000 | 0.5% | 0.5% | −447.2 | −113.1 | −334.1 | 25 |
| 20 | 40% TONE 201      | 0.5% | 0.5%  | −333.8 | −127.1 | −206.7 | 38 |
| 21 | 39% TONE 301      | 0.5% | 0.5%  | −391.0 | −316.0 | −75.0  | 81 |
| 22 | 40% PEG-400       | 0.5% | 0.5%  | −358.2 | −263.3 | −94.9  | 74 |
| 23 | 41% PPG-400       | 0.5% | 0.5%  | −351.4 | −261.4 | −90.0  | 74 |

TEG Triethyleneglycol, Aldrich Chemical Co.
PEG-400 Polyethyleneglycol, molecular weight 400, Aldrich Chemical Co.
PPG-400 Polypropylene glycol, molecular weight 400, Aldrich Chemical Co.
PS556 Carbinol terminated polydimethyl siloxane, molecular weight 1000–1500, United Technologies, Inc., Bristol, PA.
Terathane 1000 Polytetrahydrofuran, molecular weight 1000.

The depths of visible light cure as measured by hardness values at depths of 5 and 10 mm determined for several samples according to the procedure outlined in Examples 1–6. The results are shown in Table 6. Penetration of cure extended to at least 5 mm and in most cases 10 mm after 1 minute irradiation using a Visilux™ 2 source. Example 9, which did not cure at a depth of 10 mm after 1 minute light exposure, exhibited a hardness value of 27 at a depth of 10 mm after two minutes exposure to the light source. Depths of cure greater than 10 mm were possible as shown in Example 18, in which a hardness value of 23 at a depth of 20 mm was obtained after 2 minutes irradiation with a Visilux™ 2 light source.

TABLE 6

| | Hardness | |
|---|---|---|
| Example | 5 mm depth | 10 mm depth |
| 8  | 20 | 24 |
| 9  | 13 | 0  |
| 16 | 43 | 28 |

TABLE 6-continued

| | Hardness | |
|---|---|---|
| Example | 5 mm depth | 10 mm depth |
| 18 | 21 | 25 |
| 19 | 30 | 18 |
| 6  | 0  | 0  |

EXAMPLES 24–31

These Examples describe the preparation of compositions which contain various cationically curable epoxy resins, an iodonium salt initiator, an alpha diketone sensitizer, and hydroxyl-containing materials. The Examples were made in a manner similar to Example 7. The ingredients of each sample are listed in Table 7. The total weight of each composition was approximately 3 grams. Examples 24 and 29 are comparative, with these compositions containing no hydroxyl-containing materials. A few drops of propylene carbonate (Aldrich Chemical Company) was used to enhance the solubility of the iodonium salt and sensitizer in Comparative Example 29.

TABLE 7

| Example | Epoxy Resin Wt. % | Additive Wt. % | $C_6IH_5SbF_6$ Wt. % | CPQ Wt. % |
|---|---|---|---|---|
| 24 | 99% UVR 6128 | — | 0.5 | 0.5 |
| 25 | 79% UVR 6128 | 20% pTHF-250 | 0.5 | 0.5 |
| 26 | 79% UVR 6128 | 20% PEG-400 | 0.5 | 0.5 |
| 27 | 78% UVR 6128 | 21% TONE 301 | 0.5 | 0.5 |
| 28 | 79% UVR 6128 | 20% TEG | 0.5 | 0.5 |
| 29 | 99% Epon 828RS | — | 0.5 | 0.5 |
| 30 | 79% Epon 828RS | 20% pTHF-250 | 0.5 | 0.5 |
| 31 | 40% UVR 6110 39% Epon 828RS | 20% pTHF-250 | 0.5 | 0.5 |

The extent of cure of these Examples during a 5 minute visible light photolysis using Polymerization Test Method 1.

The exotherm due to the photocure in Example 30 extended to about 5 minutes beyond the point at which the lamp was shut off. In all of the other Examples, the photo-cure exotherm was measured only to the point at which the light was shut off. The results are detailed in Table 8. Each hydroxyl-containing additive increased the extent of the visible light photocure relative to the formulations that contained no such additive.

extent of cure of this sample during a 5 minute visible light photolysis was measured using the Polymerization Test Method 1. The results are detailed in Table 9. In this filled composition, the extent of cure during visible light irradiation with a 436 nm source was significant. In another experiment, Polymerization Test Method 2 was used to evaluate the extent of cure of this sample, which is also shown in Table 9.

TABLE 8

| Example | Epoxy Resin Weight % | Additive Weight % | $\Delta H_F$ mJoules/mg | $\Delta H_{FP}$ mJoules/mg | $\Delta H_{th}$ mJoules/mg | % Conversion |
| --- | --- | --- | --- | --- | --- | --- |
| 24 | 99% UVR 6128 | — | −507.2 | 0 | −507.2 | 00 |
| 25 | 79% UVR 6128 | 20% pTHF-250 | −359.1 | −318.5 | −40.5 | 89 |
| 26 | 79% UVR 6128 | 20% PEG400 | −314.7 | −158.9 | −155.8 | 50 |
| 27 | 78% UVR 6128 | 21% TONE 301 | −364.7 | −207.6 | −157.1 | 57 |
| 28 | 79% UVR 6128 | 20% TEG | −261.6 | −341.7 | −19.9 | 95 |
| 29 | 99% Epon 828RS | — | −400.2 | 0 | −400.2 | 0 |
| 30 | 79% Epon 828RS | 20% pTHF-250 | −435.0 | −391.5 | −43.5 | 90 |
| 31 | 40% UVR 6110 39% Epon 828RS | 20% pTHF-250 | −479.5 | −341.1 | −138.4 | 71 |

EXAMPLE 32

This Example describes the preparation of a composition containing a cationically curable epoxy resin, an iodonium salt initiator, an alpha diketone sensitizer, and a hydroxyl-

TABLE 9

| EXAMPLE | Polymerization Test Method (time of irradiation, min.) | $\Delta H_T$ mJoules/mg | $\Delta H_p$ mJoules/mg | $\Delta H_{th}$ mJoules/mg | % Conversion |
| --- | --- | --- | --- | --- | --- |
| 33 | Method 1, (5 min.) | −131.5 | −84.2 | −47.3 | 64 |
|  | Method 2, (1 min.) | −121.4 | — | −38.4 | 68 | containing material. A mixture comprised of 2.3997 grams UVR 6110, 0.6076 gram p-THF-250, 0.0151 gram diphenyliodoniumhexafluorophosphate, and 0.0151 gram camphorquinone was combined and stirred until a homogeneous mixture was obtained. A 5 minute visible light photolysis was measured using Polymerization Test Method 1 as described above, resulting in 97% conversion during photolysis using visible light.

EXAMPLE 33

This Example describes the preparation of a composition containing a cationically curable epoxy resin, an iodonium salt initiator, an alpha diketone sensitizer, a hydroxyl-containing material, and an inorganic filler. A stock mixture comprised of 2.7423 grams UVR 6110, 0.6727 gram p-THF-250, 0.0170 gram diphenyliodoniumhexafluoroantimonate, and 0.0170 gram camphorquinone was made and stirred until a homogeneous mixture was obtained. From this stock mixture was taken 1.293 grams of liquid which was combined and mixed with 3.970 grams of quartz filler (comprising 96% quartz having an average particle size of 2–3 microns and a maximum particle size of 20 microns and 4% Cab-O-Sil M-5 fumed silica), forming a white paste. The Comparative Example 34

This Comparative Example describes the preparation of a composition containing an iodonium salt initiator, an alpha diketone sensitizer, and an electron donor material described in European Patent Application EP 290113 along with a cationically curable epoxy resin. A mixture of 3 grams UVR 6110, 0.0179 gram diphenyliodoniumhexafluoroantimonate, 0.084 gram camphorquinone, and 0.0332 gram N,N-dimethylbenzylamine was combined and stirred in the absence of light for twelve hours until homogeneous. The extent of cure of this sample during a 5 minute visible light photolysis was determined using Polymerization Test Method 1, with no conversion of epoxy groups being observed. The combination of the iodonium salt, camphorquinone sensitizer, and electron donor such as N,N-dimethylbenzylamine did not result in an efficient visible light photocure of the epoxy-containing composition, and in fact tended to retard the cure. This composition did not cure to a significant depth as measured by the Depth of Cure test as described in Examples 1–6 (hardness=0 at 5 mm depth after 1 minute irradiation with a Visilux™2 light source).

EXAMPLES 35–44

These examples describe the preparation of filled composites which contain a cationically curable epoxy, polyol, visible light sensitizer, and an iodonium salt initiator. These composites, when irradiated with a visible light, undergo cure to significant depths.

To 0.0337 gram of camphorquinone (Aldrich Chemical Company) and 0.0678 gram of diaryl iodonium hexafluoroantimonate initiator (CD-1012, Sartomer Company) was added 1.3489 grams of polytetrahydrofuran polyol (molecular weight 250, Aldrich Chemical Company), 2.6965 grams of Epon 825 epoxy (Shell Chemical Company), and 2.5957 grams of UVR 6105 epoxy (Union Carbide Chemicals and Plastics, Inc.). The mixture was stirred with gentle heating until all of the solids were dissolved. To 1.5080 grams of the epoxy-polyol mixture was added 4.7622 grams of quartz filler (same as used in example 33). The resulting heterogeneous paste was stirred until the liquid resin was evenly dispersed throughout the sample. The composite paste was tested for depth of cure at 1 and 5 mm. using the Depth of Cure Test outlined in Example 1–6, except a single sample was measured for each thickness and time interval after the light cure.

In a similar manner, Examples 36 to 44 were prepared with different sensitizers and diaryl iodonium hexafluoroantimonate initiator using a stock mixture of epoxies and polyol comprised of 2 parts polytetrahydrofuran polyol (molecular weight 250), 4 parts Epon 825 epoxy, and 4 parts UVR 6105 epoxy with the total weight of each resin sample equaling about 4 to 10 grams. The composite paste made from each resin sample equaled approximately 4 to 10 grams. The ingredients for each Example and the percentage of quartz filler in each composite paste are detailed in Table 10.

Comparative Examples 45–49

Using the same stock epoxy resin and procedure as in Example 36, a series of comparative examples were prepared using 1,4 diphenyl-1,3-butadiene or 1,1,4,4-tetraphenyl-1,3-butadiene with diaryl iodonium hexafluoroantimonate initiator in epoxy polyol resin and the diaryl iodonium hexafluoroantimonate initiator without a visible light sensitizer in the stock epoxy-polyol mixture. Composite pastes was prepared from quartz filler using these resin samples and tested using the Depth of Cure Test. The ingredients for the resin samples and their respective hardness results are outlined in Table 10. Diaryl iodonium hexafluoroantimonate was provided at 1.0 weight percent of the total composition.

TABLE 10

| Example | Sensitizer | % Sensitizer | % Quartz Filler | Hardness 1 mm.* | Hardness 5 mm* |
|---|---|---|---|---|---|
| 35 | CPQ | 0.5 | 76.0 | 51 | 52 |
| 36 | CPQ | 0.1 | 77.3 | 52 | 52 |
| 37 | 1,8-Diphenyl-1,3,5,7-octatetraene | 0.1 | 77.6 | 53 | 0 |
| 38 | 1,6 Diphenyl-1,3,5-hexatriene | 0.1 | 77.6 | 32 | 0 |
| 39 | 10-Acetyl-2,3,6,7-Tetrahydro-1H,5H,11H-[1.]Benzopyrano[6,7,8-ij]quinolizin-11-one.[1] | 0.1 | 77.6 | 53 | 0 |
| 40 | Benzil | 0.1 | 77.6 | 34 | 0 |
| 41 | Benzil | 0.5 | 77.6 | 51 | 0 |
| 42 | Furil | 0.1 | 77.6 | 43 | 0 |
| 43 | Phenanthrenequinone | 0.1 | 77.6 | 54 | 39 |
| 44 | 1,3-Diphenyl isobenzofuran | 0.5 | 77.6 | 55 | 15 |
| Comparative 45 | 1,4 Diphenyl-1,3-butadiene | 0.1 | 77.6 | 0 | 0 |
| Comparative 46 | 1,4 Diphenyl-1,3-butadiene | 0.5 | 77.6 | 0 | 0 |
| Comparative 47 | 1,1,4,4-Tetraphenyl-1,3-butadiene | 0.1 | 78.0 | 0 | 0 |
| Comparative 48 | 1,1,4,4-Tetraphenyl-1,3-Butadiene | 0.5 | 77.6 | 0 | 0 |
| Comparative 49 | (none) | — | 77.6 | 0 | 0 |

*After 60 min.
[1]Coumarin 334, Commercially available from Aldrich Chemical Company, Inc.
CPQ - Camphorquinone This table shows that selection of sensitizer (or, in the case of comparative example 49, the presence of a sensitizer) is critical to achieving proper cure performance of epoxy-polyol resin systems.

Sensitizer Test

The following test is performed to identify the visible light sensitizer suitable for use in the present compositions:

A sensitizer and the aryliodonium salt to be used in the ultimate composition are added to a polar solvent system containing a hydroxyl-containing solvent, which system is suitable to solvate both the sensitizer and the aryliodonium salt. The polar solvent system before addition of sensitizer and aryliodonium salt has a pH not less than 4.0, preferably not less than 5.0. The solvent system should not contain materials that would interfere with cationic cure at room temperature. The sensitizer is provided as 0.1% to 1.0% by weight of the pH test solution and the aryliodonium salt is 1% by weight of the pH test solution.

The pH of the solution is measured after allowing the pH probe to equilibrate for 2 to 5 minutes in the solution, using a Corning Model 125 pH meter fitted with a Corning Semi-Micro Combination pH electrode. The pH electrode is calibrated in pH 4.0 and pH 7.0 buffer solution before use. The pH test solution is then irradiated for one minute using a 3M XL-1500 light source, with the light source held flush against the bottom of the glass vial for the duration of the photolysis. The pH of the solution is measured after equilibrating the pH probe in the irradiated solution for 5 minutes after photolysis is complete. These experiments are done under "safe" lighting conditions, using visual lighting sources that did not interfere with the experiment. Sensitizers that when tested under the above conditions yield a pH of less than about 3 (i.e. a Sensitizer Test pH of less than about 3) in the irradiated pH test solutions are suitable for use in the present compositions. Preferably, the sensitizer has a Sensitizer Test pH of less than about 2, and more preferably a Sensitizer Test pH of less than about 1.

The preferred polar solvent system for use in the Sensitizer Test is ethanol, or ethanol with an optional cosolvent such as methylethyl ketone (MEK), methylene chloride or toluene. The cosolvent is provided to assist in solvating the proposed sensitizer.

Sensitizer Tests were performed on specific sensitizer candidates as follows:

To a clear glass vial was added 0.0201 gram of CD-1012 diaryl iodonium hexafluoroantimonate initiator and 0.0101 gram of camphorquinone sensitizer. The solids were dissolved in 2 ml. of denatured ethanol. For sensitizers that exhibited low solubility in ethanol, they were first dissolved in 1 ml. of methyl ethyl ketone (MEK) or methylene chloride, then diluted with 1 ml. of ethanol. The pH of the solution was measured after allowing the pH probe to equilibrate for 2 to 5 minutes in the solution using a Corning model 125 pH meter fitted with a Corning Semi-Micro Combination pH electrode. The pH electrode was calibrated in pH 4.0 and pH 7.0 buffer solution before use. The sample was then irradiated for 1 minute using a 3M XL-1500 light source, with the light source held flush against the bottom of the glass vial for the duration of the photolysis. The pH of the solution was measured after equilibrating the pH probe in the irradiated solution for 5 minutes after photolysis was complete. These experiments were done under "safe" lighting conditions, using visible lighting sources which did not interfere with the experiment. Sensitizer-iodonium salt combinations that gave a pH of less than 3; preferably less than 2, and more preferably less than 1 provided a good photocurable formulation when combined with an epoxy-polyol resin.

In a similar manner, sensitizer/iodonium salt pairs that were used in Examples 36 to 44 were tested using the Sensitizer Test. The compositions of the sensitizers, iodonium salts, and the results from the Sensitizer Test are outlined in Table 11. The pH of solutions containing the sensitizer-iodonium salt combinations in Comparative Examples 45 to 49 were also measured using the Sensitizer Test. These sensitizer-initiator or initiator-only combinations which were ineffective in terms of curing epoxypolyol resins did not exhibit a decrease in pH to a value less than 3 upon irradiation with a visible light source.

TABLE 11

| Sensitizer | Sensitizer % | Initiator | pH Before Photolysis | pH After Photolysis[a] |
|---|---|---|---|---|
| CPQ | 0.5 | CD-1012 | 7.59 | 0.01 |
| 1,8-Diphenyl-1,3,5,7-octatetraene[c] | 0.1 | CD-1012 | 6.72 | 0.02 |
| 1,6 Diphenyl-1,3,5-hexatriene[c] | 0.1 | CD-1012 | 6.60 | 0.54 |
| Coumarin 334 | 0.1 | CD-1012 | 7.21 | 0.56 |
| Benzil | 0.5 | CD-1012 | 6.62 | 1.68 |

TABLE 11-continued

| Sensitizer | Sensitizer % | Initiator | pH Before Photolysis | pH After Photolysis[a] |
|---|---|---|---|---|
| Furil[d] | 0.5 | CD-1012 | 6.81 | 1.28 |
| Phenanthrenequinone | 0.1 | CD-1012 | 6.52 | 0.15 |
| Diphenyl isobenzofuran | 0.5 | CD-1012 | 7.10 | 0.28 |
| CPQ | 0.2 | $Ph_2IPF_6$[b] | 5.20 | 0.03 |
| 1,4 Diphenyl-1,3-butadiene[d] | 0.5 | CD-1012 | 6.59 | 5.95 |
| 1,1,4,4-Tetraphenyl-1,3-butadiene[c] | 0.5 | CD-1012 | 5.59 | 5.27 |
| — | — | CD-1012[d] | 6.18 | 5.41 |

[a]After 5 min.
[b]$Ph_2IPF_6$ - diphenyliodonium hexafluorophosphate
[c]1:1 ethanol: $CH_2Cl_2$ (volume)
[d]1:1 MEK:EtOH (volume)

EXAMPLE 50

This example describes the preparation of a filled epoxy composition using a visible light sensitizer and diphenyliodonium hexafluorophosphate which undergoes visible light cure to significant depth. A resin mixture was prepared in which 0.0406 gram of camphorquinone and 0.0858 grams of diphenyliodonium hexafluorophosphate were dissolved in 3.080 grams of UVR 6105 cycloaliphatic epoxy, 1.6062 grams of polytetrahydrofuran (molecular weight 250), and 3.2004 grams of Epon 825 bis phenol A epoxy using mild heat. To 1.8093 grams of this resin formulation was added 6.4027 grams of quartz filler. The mixture was stirred until the resin was evenly dispersed throughout the composite paste. The cure of the composite paste at a depth of 5 mm. was measured after 1 minute irradiation with a Visilux 2 light source. Using the Depth of Cure Test as described in Example 1–6, the hardness of the composite at a depth of 5 mm. after curing was 52.

The sensitizer and iodonium salt combination used in this composite was tested using the Sensitizer Test described in Comparative Examples 45–49. A solution containing 0.0195 gram of diphenyliodonium hexafluorophosphate, 0.0097 gram of camphorquinone, and 2 ml. of denatured ethanol was irradiated for 1 min. using a 3M XL-1500 light source, yielding a pH value for the solution after photolysis of –0.58 (solution pH before photolysis was 5.50).

EXAMPLES 51–52

These examples describe the preparation of filled epoxy composites which contain varying quantities of polyol, epoxy, and a visible light sensitizer and iodonium initiation. These Examples were prepared in a manner similar to Example 35. The resin ingredients for each Example are detailed in Table 12. In Example 51, 1.8391 g of the resin was combined with 6.4460 g of quartz filler. In Example 52, 0.995 g of the resin was combined with 3.008 g of quartz filler. The hardness after curing these sample composites was determined using the Depth of Cure Test detailed in Example 1–6, except one reading was taken per sample tested. The extent of cure of the sample composites were tested using Polymerization Test Methods 1 and 2. In Test Method 1, the samples were irradiated according to the procedure outlined in Example 1–6. In Test Method 2, the light source was a Visilux 2 lamp which was used for a duration of 1 min. at a distance of 10 mm. from the samples. The percent conversion from Test Method 1 and 2 and the results from the Depth of Cure Test are outlined in Table 12.

TABLE 12

| | CPQ | Ph$_2$ISbF$_6$ | pTHF-250 | Epon 825 | UVR 6105 | Hardness* | % Conversion Test 1 | % Conversion Test 2 |
|---|---|---|---|---|---|---|---|---|
| Example 51 | 0.5 | 0.5 | 10 | 40 | 49 | 46 | 44 | 68 |
| Example 52 | 0.5 | 0.5 | 20 | 59 | 20 | 53** | 78 | 93 |

*5 mm Depth after 60 min.
**5 mm Depthe after 30 min.

EXAMPLE 53

This example describes the preparation of a filled epoxy composite using a silane coupling agent in conjunction with quartz filler. A silane-treated filler was prepared by adding 1 gram of 3-glycidoxypropyltrimethoxysilane (Aldrich Chemical Company) to a slurry containing 10 grams of quartz filler in 15 grams of deionized H$_2$O and 1 gram of methanol. The slurry was acidified with one drop of trifluoroacetic acid (Aldrich Chemical Company) before the addition of the silane agent. The slurry was stirred at room temperature for 2 hours and then the solvent was evaporated by heating the slurry to 90° C. The resulting white solid was further dried at 110° C. for 2 hours. The white solid was ground into a fine powder with a mortar and pestle. To 4.7640 grams of the silane-treated filler was mixed 1.520 grams of a light curable epoxy mixture comprised of 17.7063 grams of Epon 825, 6.0302 grams of polytetrahydrofuran (molecular weight 250, Aldrich Chemical Company), 6.0025 grams of UVR 6105 (Union Carbide), 0.1505 gram diphenyliodonium hexafluoroantimonate, and 0.1504 gram camphorquinone (Aldrich Chemical Company). The hardness after visible light curing of the sample composite was determined using the Depth of Cure Test detailed in Example 1–6, except one reading was taken per sample tested. The extent of cure of the sample composite was tested using Polymerization Test Methods 1 and 2. In Test Method 1, the sample was irradiated according to the procedure outlined in Example 1–6. In Test Method 2, the light source was a Visilux 2 lamp which was used for a duration of 1 min. at a distance of 10 mm. from the sample. The percent conversions from Test Method 1 and 2 and the Depth of Cure Test results are outlined in Table 13.

TABLE 13

| | Hardness at 5 mm.* | % Conversion Test 1 | % Conversion Test 2 |
|---|---|---|---|
| Example 53 | 38 | 74 | 95 |

*After 60 min.

EXAMPLE 54

This example describes the preparation and the diametral tensile and compressive strength properties of a filled epoxy composite which contains a visible light sensitizer and diphenyliodonium hexafluoroantimonate. A stock mixture of 1.2020 grams of polytetrahydrofuran (molecular weight= 250), 2.4293 grams of Epon 825 epoxy, 2.3642 grams of UVR 6105 epoxy, 0.0302 gram of camphorquinone, and 0.0302 gram of diphenyliodonium hexafluoroantimonate was prepared. To 2.5756 grams of the stock mixture was added 8.4040 grams of quartz filler. The composite paste was stirred until the resin was evenly dispersed throughout the filler. The composite paste was prepared for diametral tensile and compressive strength testing using the following procedure. For diametral tensile strength measurements, uncured paste examples were packed into a glass tube having a 4 mm inner diameter. Each sample was subjected to 40 psi pressure for 15 minutes, then cured by exposure to two standard dental lights (3M Visilux 2) for 80 seconds. The samples were then irradiated for 30 seconds using a Dentacolor XS Kulzer unit. The cured paste was cut on a diamond saw to form a 2 mm long plug. The plug was stored in distilled water at 37° C. for 24 hours and its diametral tensile strength was then determined according to American Dental Association ("ADA") specification No. 27 using an "Instron" tensile tester. The compressive strength was measured on samples similarly prepared, although cut to a length of 8 mm according to ADA specification No. 9.

The diametral and tensile values for this example are listed in Table 14.

TABLE 14

| | Diametral Tensile | Standard Deviation | Compressive Strength | Standard Deviation |
|---|---|---|---|---|
| Example 54 | 47.1 mPa | 3.7 mPa | 198.5 mPa | 10.8 mPa |

What is claimed:

1. A visible-light photopolymerizable dental composition useful for polymerization in the oral environment comprising:
    a) a cationically polymerizable epoxy resin,
    b) a hydroxyl-containing material having no additional functionality or a hydroxyl-containing material that contains other functionalities that do not substantially interfere with cationic cure at room temperature,
    c) an aryliodonium salt,
    d) a visible light sensitizer having an extinction coefficient less than about 1000 lm$^{-1}$ cm$^{-1}$ in the visible light range and having a Sensitizer Test pH of less than about 3, and
    e) a dental filler present in the composition as at least about 50% by weight of the total composition;
    wherein the components of said composition are present in amounts sufficient to provide cure of said composition resin by exposure to visible light to a cure depth of at least about 1 mm.

2. The composition of claim 1, said composition comprising an additional cationically curable resin other than an epoxy resin.

3. The composition of claim 2, wherein said additional cationically curable resin is selected from the group consisting of oxetanes, oxolanes, cyclic acetals, lactams, lactones, and vinyl ethers.

4. The composition of claim 1, wherein said visible light sensitizer has a Sensitizer Test pH of less than about 2.

5. The composition of claim 1, wherein said visible light sensitizer has a Sensitizer Test pH of less than about 1.

6. The composition of claim 1, wherein said visible light sensitizer has an extinction coefficient less than about 200 lm$^{-1}$ in the visible light range.

7. The composition of claim 1, wherein said visible light sensitizer has an extinction coefficient less than about 150 lm$^{-1}$ in the visible light range.

8. The composition of claim 1, wherein said hydroxyl-containing material has an average hydroxyl functionality of greater than about 1.

9. The composition of claim 1, wherein at least 50% of the hydroxyl functionality of said hydroxyl-containing material are primary aliphatic hydroxy.

10. The composition of claim 1, wherein said hydroxyl-containing material is a blend of at least two hydroxyl-containing materials that are different from each other, selected from the group consisting of (a) hydroxyl-containing material having a weight average molecular weight between about 32 to 200, (b) hydroxyl-containing material having a weight average molecular weight between about 200 to 10,000 and (c) hydroxyl-containing material having a weight average molecular weight above about 10,000.

11. The composition of claim 1, wherein said hydroxyl-containing material is selected from the group consisting of polyoxyethylene glycols, polyoxypropylene glycols, polytetramethylene oxide glycols, hydroxyethylated cellulose, hydroxypropylated cellulose, hydroxy-terminated polyesters, hydroxy-terminated polylactones, ethoxylated bis-phenol A and hydroxy-terminated polyalkadienes.

12. The composition of claim 1, wherein said hydroxyl-containing material is present in the composition at an amount between about 1–90% by weight based on the total weight of the composition.

13. The composition of claim 1, wherein said hydroxyl-containing material is present in the composition at an amount between about 5–70% by weight based on the total weight of the composition.

14. The composition of claim 1, wherein said hydroxyl-containing material is present in the composition at an amount between about 10–50% by weight based on the total weight of the composition.

15. The composition of claim 1, wherein said aryliodonium salt is selected from the group consisting of diaryliodonium hexafluorophosphate and diaryliodonium hexafluoroantimonate.

16. The composition of claim 1, wherein the components of said composition are present in amounts sufficient to provide cure of said photopolymerizable resin by exposure to visible light to a cure depth of at least about 5 mm.

17. A polymerized composition of claim 1, wherein said composition has a thickness greater than 1 mm.

18. A polymerized composition of claim 1, wherein said composition has a thickness greater than 5 mm.

19. A visible-light photopolymerizable dental composition useful for polymerization in the oral environment comprising:

a) a cationically polymerizable epoxy resin, b) a hydroxyl-containing material that does not substantially interfere with cationic cure at room temperature, c) an aryliodonium salt, and d) a visible light sensitizer having an extinction coefficient less than about 1000 lm$^{-1}$ cm$^{-1}$ in the visible light range and having a Sensitizer Test pH of less than about 3;

wherein the components of said composition are present in amounts sufficient to provide cure of said photopolymerizable resin by exposure to visible light to a cure depth of at least about 1 mm.

20. The composition of claim 2, said composition comprising an additional cationically curable resin other than an epoxy resin.

21. The composition of claim 20, wherein said additional cationically curable resin is selected from the group consisting of oxetanes, oxolanes, cyclic acetals, lactams, lactones, and vinyl ethers.

22. The composition of claim 2, wherein said visible light sensitizer has a Sensitizer Test pH of less than about 2.

23. The composition of claim 2, wherein said visible light sensitizer has a Sensitizer Test pH of less than about 1.

24. The composition of claim 2, wherein said visible light sensitizer has an extinction coefficient less than about 200 lm$^{-1}$ in the visible light range.

25. The composition of claim 2, wherein said visible light sensitizer has an extinction coefficient less than about 150 lm cm$^{-1}$ in the visible light range.

26. The composition of claim 2, wherein said hydroxyl-containing material has an average hydroxyl functionality of greater than about 1.

27. The composition of claim 2, wherein at least 50% of the hydroxyl functionality of said hydroxyl-containing material are primary aliphatic hydroxy.

28. The composition of claim 2, wherein said hydroxyl-containing material is a blend of at least two hydroxyl-containing materials that are different from each other, selected from the group consisting of (a) hydroxyl-containing material having a weight average molecular weight between about 32 to 200, (b) hydroxyl-containing material having a weight average molecular weight between about 200 to 10,000 and (c) hydroxyl-containing material having a weight average molecular weight above about 10,000.

29. The composition of claim 2, wherein said hydroxyl-containing material is selected from the group consisting of polyoxyethylene glycols, polyoxypropylene glycols, polytetramethylene oxide glycols, hydroxyethylated cellulose, hydroxypropylated cellulose, hydroxy-terminated polyesters, hydroxy-terminated polylactones, ethoxylated bis-phenol A and hydroxy-terminated polyalkadienes.

30. The composition of claim 2, wherein said hydroxyl-containing material is present in the composition at an amount between about 1–90% by weight based on the total weight of the composition.

31. The composition of claim 2, wherein said hydroxyl-containing material is present in the composition at an amount between about 5–70% by weight based on the total weight of the composition.

32. The composition of claim 2, wherein said hydroxyl-containing material is present in the composition at an amount between about 10–50% by weight based on the total weight of the composition.

33. The composition of claim 2, wherein said aryliodonium salt is selected from the group consisting of diaryliodonium hexafluorophosphate and diaryliodonium hexafluoroantimonate.

34. The composition of claim 2, wherein the components of said composition are present in amounts sufficient to provide cure of said photopolymerizable resin by exposure to visible light to a cure depth of at least about 5 mm.

35. A polymerized composition of claim 2, wherein said composition has a thickness greater than 1 mm.

36. A polymerized composition of claim 2, wherein said composition has a thickness greater than 5 mm.

* * * * *

UNITED STATES PATENT AND TRADEMARK OFFICE
CERTIFICATE OF CORRECTION

PATENT NO.: 5,856,373
DATED: January 5, 1999
INVENTOR(S): David A. Kaisaki, Sumita B. Mitra, William J. Schultz and Robert J. DeVoe It is certified that error appears in the above-identified patent and that said Letters Patent is hereby corrected as shown below:

Col. 25, line 6 (claim 6), insert --$cm^{-1}$-- after "about 200 $lm^{-1}$".

Col. 25, line 9 (claim 7), insert --$cm^{-1}$-- after "about 150 $lm^{-1}$".

Col. 26, line 5 (claim 20), replace "claim 2" with --claim 19--.

Col. 26, line 11 (claim 22), replace "claim 2" with --claim 19--.

Col. 26, line 13 (claim 23), replace "claim 2" with --claim 19--.

Col. 26, line 15 (claim 24), replace "claim 2" with --claim 19--.

Col. 26, line 17 (claim 24), insert --$cm^{-1}$-- after "about 200 $lm^{-1}$".

Col. 26, line 18 (claim 25), replace "claim 2" with --claim 19--.

Col. 26, line 19 (claim 25), insert --$^{-1}$-- after "150 lm".

Col. 26, line 20 (claim 26), replace "claim 2" with --claim 19--.

Col. 26, line 23 (claim 27), replace "claim 2" with --claim 19--.

Col. 26, line 26 (claim 28), replace "claim 2" with --claim 19--.

Col. 26, line 35 (claim 29), replace "claim 2" with --claim 19--.

Col. 26, line 42 (claim 30), replace "claim 2" with --claim 19--.

Col. 26, line 46 (claim 31), replace "claim 2" with --claim 19--.

Col. 26, line 50 (claim 32), replace "claim 2" with --claim 19--.

Col. 26, line 54 (claim 33), replace "claim 2" with --claim 19--.

Col. 26, line 57 (claim 34), replace "claim 2" with --claim 19--.

UNITED STATES PATENT AND TRADEMARK OFFICE
CERTIFICATE OF CORRECTION

PATENT NO.: 5,856,373

DATED: January 5, 1999

INVENTOR(S): David A. Kaisaki, Sumita B. Mitra, William J. Schultz and Robert J. DeVoe It is certified that error appears in the above-identified patent and that said Letters Patent is hereby corrected as shown below:

Col. 26, line 61 (claim 35), replace "claim 2" with --claim 19--.

Col. 26, line 63 (claim 36), replace "claim 2" with --claim 19--.

Signed and Sealed this

Ninth Day of January, 2001

Attest:

Attesting Officer

Q. TODD DICKINSON

Commissioner of Patents and Trademarks